United States Patent
Kurt et al.

(10) Patent No.: US 6,791,665 B2
(45) Date of Patent: Sep. 14, 2004

(54) LITHOGRAPHIC PROJECTION APPARATUS AND DEVICE MANUFACTURING METHOD

(75) Inventors: Ralph Kurt, Eindhoven (DE); Levinus Pieter Bakker, Helmond (NL); Frank Jeroen Pieter Schuurmans, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/686,813

(22) Filed: Oct. 17, 2003

(65) Prior Publication Data

US 2004/0130694 A1 Jul. 8, 2004

(30) Foreign Application Priority Data

Oct. 18, 2002 (EP) .............................. 02079329

(51) Int. Cl.$^7$ .............................................. G03B 27/42
(52) U.S. Cl. ................ 355/53; 72/75; 72/76; 378/34; 430/5; 430/31
(58) Field of Search ............................ 355/53, 69, 72, 355/75, 77; 430/5, 30, 31; 378/34

(56) References Cited

U.S. PATENT DOCUMENTS

| 2002/0109828 | A1 | 8/2002 | Moors et al. ................. 355/76 |
| 2003/0095623 | A1 | 5/2003 | Singer et al. ................. 378/34 |

FOREIGN PATENT DOCUMENTS

| EP | 0987601 | 3/2000 |
| EP | 1182510 | 2/2002 |
| EP | 1223466 | 7/2002 |
| WO | WO 99/42904 | 8/1999 |

OTHER PUBLICATIONS

EP Search Report for EP 02079329.5 dated Aug. 22, 2003.
William Partio et al., "Development of an EUV (13.5 nm) LIght Source Employing a Dense Plasma Focus in LIthium Vapor," Proc. of SPIE, vol. 3997, pp. 136–156 (2000).
Malcolm W. McGeoch, "Power Scaling of a Z–Pinch Extreme Ultravoilet Source," Proc. of SPIE, vol. 3997, pp. 861–866 (2000).
Klaus Bergmann et al., "Highly Repetitive, Extreeme–Ultravoilet Radiation Source Based on a Gas–Discharge Plasma," Applied Optics, vol. 38, pp. 5413–5417 (1999).
Silvast et al., "High–power plasma discharge source at 13.5 nm and 11.4 nm for EUV lithography," Proc. SPIE 3676:272–275 (1999).

*Primary Examiner*—D. Rutledge
(74) *Attorney, Agent, or Firm*—Pillsbury Winthrop LLP

(57) ABSTRACT

A lithographic projection apparatus is provided wherein an object situated in a pulsed beam of radiation has an electrode in its vicinity and a voltage source connected either to the electrode or to the object. This configuration can provide a negative voltage pulse to the object relative to the electrode. The beam of radiation and the voltage pulse from the voltage source are provided in phase or out of phase. In this way, the object is shielded against secondary electrons generated by radiation beam illumination.

24 Claims, 4 Drawing Sheets

LITHOGRAPHIC PROJECTION APPARATUS AND DEVICE MANUFACTURING METHOD

This application claims priority from European patent application EP 02079329.5 filed Oct. 18, 2002, herein incorporated in its entirety by reference.

FIELD

The invention relates to contamination control and measurement and dose control and measurement, for example, in relation to a lithographic projection apparatus and method.

BACKGROUND

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference.

In the case of a programmable mirror array, the said support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically directs itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, both incorporated herein by reference.

In a lithographic apparatus the size of features that can be imaged onto a substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation in the range of 5 to 20 nm, especially around 13 nm. Such radiation is termed extreme ultraviolet (EUV) or soft x-ray and possible sources for that radiation include, for instance, laser-produced plasma sources, discharge plasma sources, or synchrotron radiation from electron storage rings. Apparatus using discharge plasma sources are described, for example, in W. Partlo, I. Fomenkov, R. Oliver, D. Birx, "Development of an EUV (13.5 nm) Light Source Employing a Dense Plasma Focus in Lithium Vapor", Proc. SPIE 3997, pp. 136–156 (2000); M. W. McGeoch, "Power Scaling of a Z-pinch Extreme Ultraviolet Source", Proc. SPIE 3997, pp. 861–866 (2000); W. T. Silfvast, M. Klosner, G. Shimkaveg, H. Bender, G. Kubiak, N. Fomaciari, "High-Power Plasma Discharge Source at 13.5 and 11.4 nm for EUV lithography", Proc. SPIE 3676, pp. 272–275 (1999); and K. Bergmann et al., "Highly Repetitive, Extreme Ultraviolet Radiation Source Based on a Gas-Discharge Plasma", Applied Optics, Vol. 38, pp. 5413–5417 (1999).

EUV radiation sources may require the use of a rather high partial pressure of a gas or vapor to emit EUV radiation, such as in discharge plasma radiation sources referred to above. In a discharge plasma source, for instance, a discharge is created in between electrodes, and a resulting partially ionized plasma may subsequently be caused to collapse to yield a very hot plasma that emits radiation in the EUV range. The very hot plasma is quite often created using Xe, since a Xe plasma radiates in the EUV range around 13.5 nm. For efficient EUV production, a typical pressure of 0.1 mbar is used near the electrodes of the radiation source. A drawback of having such a rather high Xe pressure is that Xe gas absorbs EUV radiation. For example, 0.1 mbar Xe transmits over 1 m only 0.3% EUV radiation having a wavelength of 13.5 nm. It is therefore required to confine the rather high Xe pressure to a limited region around the source. To achieve this the source can be contained in its own vacuum chamber that is separated by a chamber wall from a subsequent vacuum chamber in which collector and illumination optics may be provided.

Molecular contamination by, for instance, carbon on optical components in a lithographic projection apparatus (e.g. grazing incidence and multi-layer mirrors in a EUV lithographic projection apparatus) is a significant problem. For example, contamination of reflective elements in an EUV lithographic projection apparatus can be caused by the presence of hydrocarbons and secondary electrons that are generated by EUV illumination. A further problem is how to monitor the dose of radiation from a source and the amount of contamination that gathers on an optical component.

SUMMARY

Accordingly, it would be advantageous to reduce the amount of contamination caused by illumination of radiation, particularly EUV radiation, on optical components in a lithographic projection apparatus. It would also be advantageous to provide a lithographic projection apparatus in which optical elements, particularly reflective elements used with EUV radiation, are shielded against secondary electrons and in which at the same time the attraction of positively charged particles is prevented. It would also be advantageous to provide a technique for measuring dose and contamination and to reduce the amount of sputtering on optical components by positive ions.

According to an aspect of the invention, there is provided a lithographic projection apparatus comprising:

a radiation system to form a projection beam of radiation, from radiation emitted by a radiation source;

a support structure constructed to hold a patterning device, to be irradiated by the projection beam to pattern said projection beam;

a substrate table constructed to hold a substrate; and a projection system constructed and arranged to image an irradiated portion of the patterning device onto a target portion of the substrate, a shield means for generating an electromagnetic field so as to prevent secondary electrons formed during irradiation to become incident on an object to be shielded, said shield means comprising:

an electrode in the vicinity of the object, and a voltage source connected to the object and/or the electrode for providing a voltage to the object relative to the electrode, wherein the radiation source is adapted to be operated in a pulsed manner between a high state and a low state, and the lithographic apparatus comprises synchronization means for providing a time varying voltage to the object and/or to the electrode in synchronism with the radiation source, the time varying voltage imparting a repetitive negative potential to the object relative to the electrode.

Molecular contamination can be reduced by repelling secondary electrons from optical components. Thus, secondary electrons are repelled by a negative (relative) potential pulse from the surface of the object in the radiation beam, or are drawn away by the positive (relative) potential of the electrode. Reduction of molecular contamination and, as discussed below, electron flux measurements can use an electric field to repel electrons from an optical component.

In an embodiment, the lithographic projection apparatus may be provided with a time varying voltage that imparts the repetitive negative potential to the object relative to the electrode for a time period sufficient for transporting substantially all the secondary electrons formed during irradiation away from the object. In this way, secondary electrons are swiftly and substantially completely removed upon generation, as electrons which are present above the irradiated surface of the object can enhance molecular contamination of the surface of the object. For example, when the negative potential pulse is provided sufficiently long after the end of an EUV radiation pulse on an object to allow the (freed) secondary electrons to migrate from the object to the electrode, an electron cloud may not be not present.

In an embodiment, the lithographic projection apparatus may be provided with a negative potential pulse that is applied during a time of between 0.01 microseconds and 10 microseconds, preferably 0.1 microsecond. This time span is long enough to properly repel the secondary electrons which are relatively light. It is however, short enough so as not to cause acceleration and attraction of heavier particles with a positive charge towards the object to be shielded.

In an embodiment, the lithographic projection apparatus may be provided with a negative potential pulse between 0 V and −1000 V, preferably −100 V. With such a voltage, secondary electrons can be drawn off from the object in the radiation beam or repelled therefrom such that they only cross the surface of the object once, and hence reduce the amount of contamination caused thereby.

In an embodiment, the voltage source is connected to the object. Direct connection of the negative voltage to the object causes secondary electrons to be rapidly expelled away from the object without a chance of recapture. The positive electrode may be placed at a larger distance from the object or may be formed by the wall of the vacuum chamber.

In an embodiment, the voltage source is connected to the electrode in the vicinity of the object. By applying a positive voltage to the electrode, negatively charged particles such as secondary electrons can be pulled away from the object.

In an embodiment, the negative potential may be applied in phase with the high state of the radiation source. Advantageously, secondary electrons that are generated during a radiation pulse are repelled from the surface on which the radiation impinges by a relatively short negative voltage pulse at the moment when they are formed. Hence the possibility that they return to the surface of the object and cross said surface for a second time is reduced such that the chances of contamination decrease.

In an embodiment, the phase difference between application of the negative potential and the high state of the radiation source may be arbitrary. It is not always necessary to drive the radiation source and provide the pulsed voltage exactly at the same time. An arbitrary phase difference between the radiation pulse and the voltage pulse is also acceptable.

In an embodiment, the repetitive negative potential may be succeeded by an associated positive potential. An electric field will also accelerate positive ions towards an optical component. The resulting ion bombardment can lead to sputtering of the surface of the optical component. Applying a positive potential overcomes the problem that positively charged ions will gain momentum and, particularly in a low pressure environment, move towards the surface of the object to be shielded. The reason is that the relatively heavy ions will experience the time averaged field, which in this case will approximate to zero. The relatively light secondary electrons, on the contrary, will conform to the momentarily present field and thus be removed by the negative voltage pulse.

In an embodiment, a measuring device configured to measure the current generated by secondary electrons in the electrode may be provided. The dose of radiation from a source and the amount of contamination that gathers on an optical component can be monitored by measuring the electron flux from the optical component. An amount of secondary electrons collected is a measure for the dose of radiation and the amount of contamination. This measure may be easily determined using current measuring means connected to the electrode. The current can also be measured at the object.

According to an aspect of the invention, there is provided a method of manufacturing an integrated structure by a lithographic process comprising:
  providing a radiation system to form a projection beam of radiation, from radiation emitted by a radiation source, wherein the radiation source is adapted to be operated in a pulsed manner between a high state and a low state;
  providing a support structure constructed to hold patterning means, to be irradiated by the projection beam to pattern said projection beam;
  providing a substrate table constructed to hold a substrate;
  providing a projection system constructed and arranged to image an irradiated portion of the patterning means onto a target portion of the substrate;
  generating an electromagnetic field so as to prevent secondary electrons formed during irradiation to become incident on an object to be shielded;
  operating the radiation source in a pulsed manner between a high state and a low state; and
  providing a time varying voltage to the object and/or to an electrode provided in the vicinity of the object in synchronism with the radiation source, the time varying voltage imparting a repetitive negative potential to the object relative to the electrode.

Although specific reference may be made in this text to the use of the apparatus according to an embodiment to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
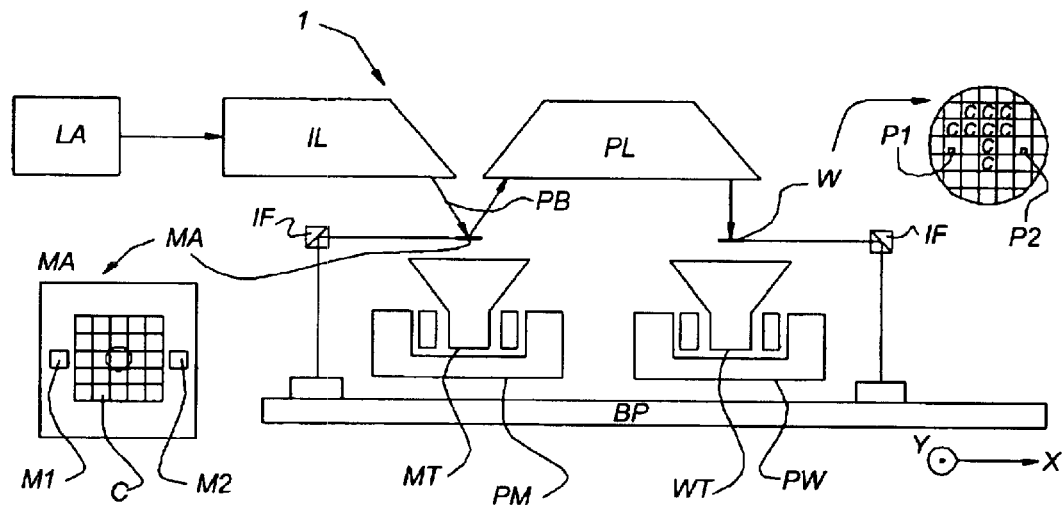
FIG. 1 schematically depicts a lithographic projection apparatus according to an embodiment of the invention.

FIG. 1 schematically depicts a lithographic projection apparatus 1 according to a particular embodiment of the invention. The apparatus comprises:

- a radiation system IL for supplying a projection beam PB of radiation (e.g. EUV radiation with a wavelength of 11–14 nm). In this particular case, the radiation system also comprises a radiation source LA;
- a first object table (mask table) MT provided with a mask holder for holding a mask MA (e.g. a reticle), and connected to first positioning means PM for accurately positioning the mask with respect to item PL;
- a second object table (substrate table) WT provided with a substrate holder for holding a substrate W (e.g. a resist-coated silicon wafer), and connected to second positioning means PW for accurately positioning the substrate with respect to item PL; and
- a projection system ("lens") PL for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a discharge plasma EUV radiation source) produces a beam of radiation. This beam is fed into an illumination system (illuminator) IL, either directly or after having traversed conditioning means, such as a beam expander, for example. The illuminator IL may comprise adjusting means for setting the outer and/or inner radial extent (commonly referred to as σ-outer and σ-inner, respectively) of the intensity distribution in the beam. In addition, it will generally comprise various other components, such as an integrator and a condenser. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1 However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
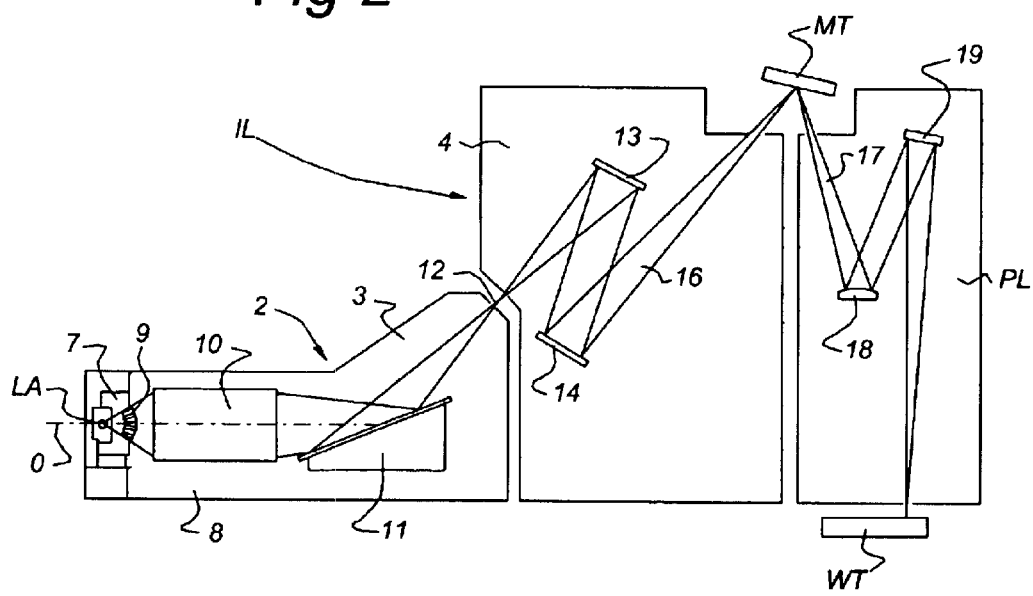
FIG. 2 shows a side view of an EUV illumination system and projection optics of a lithographic projection apparatus according to an embodiment of the invention.

FIG. 2 shows a projection apparatus 1 comprising radiation system IL with a collector source unit or radiation unit 3 and an illumination optics unit 4, and projection optics system PL. Radiation unit 3 is connected to a radiation source unit LA comprising a radiation source 6, for example, a discharge plasma source 6 (see, e.g., FIG. 3). An EUV radiation source 6 may employ a gas or vapor, such as Xe gas or Li vapor in which a very hot plasma is created to emit radiation in the EUV range of the electromagnetic spectrum. The very hot plasma may be created by causing a partially ionized plasma of an electrical discharge to collapse onto the optical axis O. Partial pressures of 0.1 mbar of Xe gas, Li vapor or any other suitable gas or vapor may be used for efficient generation of the radiation. The radiation emitted by radiation source 6 is passed from a source chamber 7 into a collector chamber 8 via a gas barrier structure or "foil trap" 9. The gas barrier structure may comprise a channel structure such as described in European patent applications EP-A-1 223 468 and EP-A-1 057 079, which are incorporated herein in their entirety by reference.

The collector chamber 8 comprises a radiation collector 10 which may be a grazing incidence collector. Radiation passed by collector 10 is reflected off a grating spectral filter 11 to be focused in a virtual source point 12 at an aperture in the collector chamber 8. From chamber 8, the radiation beam 16 is reflected in illumination optics unit 4 via normal incidence reflectors 13, 14 onto a reticle or mask positioned held by a reticle or mask table MT. A patterned beam 17 is formed which via reflective elements 18, 19 in projection optics system PL is imaged onto a substrate table WT. More elements than shown may generally be present in the illumination optics unit 4 and projection system PL.

Figure 3:
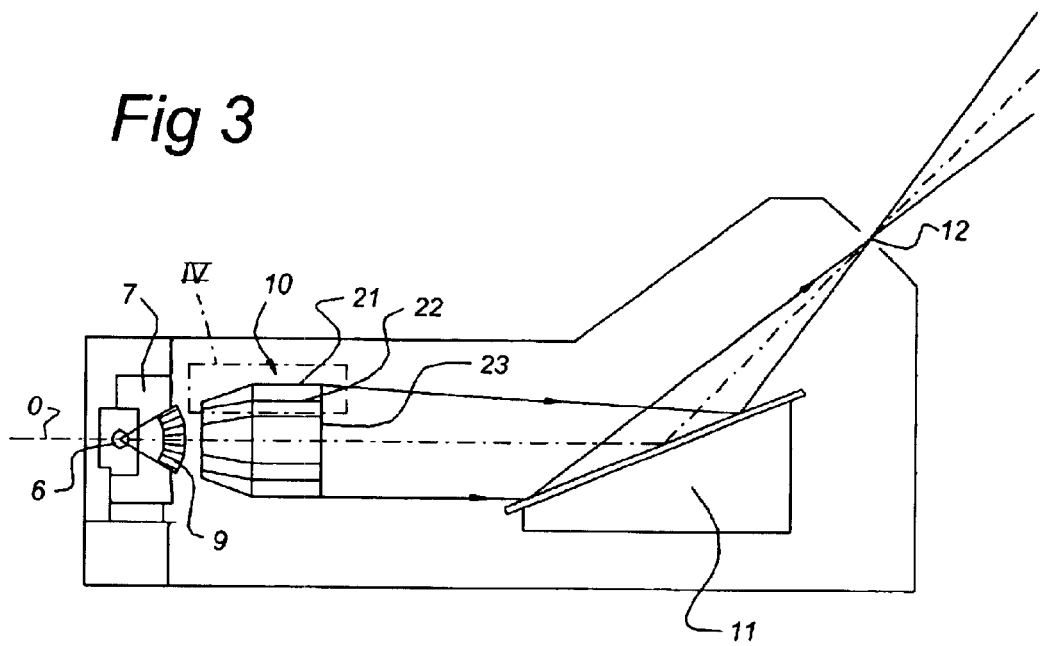
FIG. 3 shows a detail of a radiation source and grazing incidence collector according to an embodiment of the present invention.

As can be seen in FIG. 3, a grazing incidence collector 10 comprises a number of nested reflector elements 21, 22, 23. A grazing incidence collector of this type is well known in the literature as a "Wolter" type and is, for instance, shown in German patent application DE-101 38 284.7.

Figure 4:
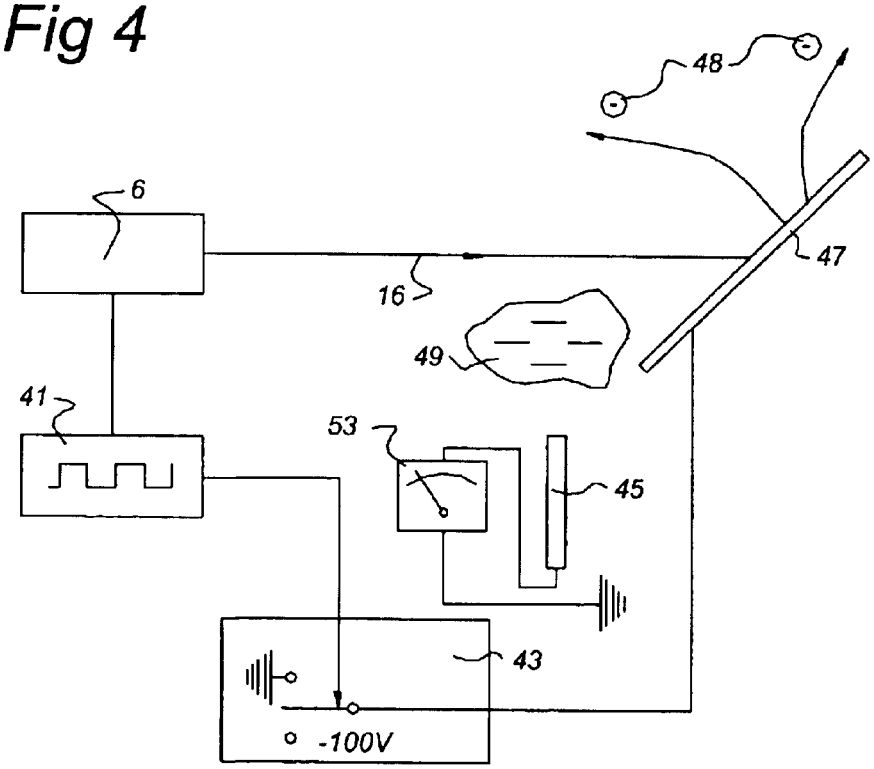
FIG. 4 shows an arrangement of a first embodiment of the present invention.

FIG. 4 shows a first embodiment according to the present invention. A radiation source 6 (e.g., EUV source), that can provide a pulsed beam of radiation or radiation pulse 16, is connected to a timer circuit 41. The timer circuit 41 receives input from the radiation source 6 and provides an output signal to a voltage source 43 that can supply a voltage, preferably a voltage pulse, to an object 47, for instance an optical component such as a mirror or mask. The voltage maybe shaped as a square wave voltage pulse or a sinusoidal wave voltage pulse. Differently shaped voltage pulses are possible as well. The voltage source 43 is connected to the object 47. When the beam (e.g., EUV radiation beam) originating from the source 6 impinges on the surface of the object 47, secondary electrons 48 are generated. The secondary electrons 48 may be repelled by a negative voltage. The voltage source 43 can alternately connect the object 47 to a voltage as low as −100 V and ground. In the vicinity of the object 47 an electrode 45 is provided with a voltage, for instance ground, higher than the lower voltage provided by the voltage source 43 to the object 47. The assembly can operate in two ways.

Firstly, the timer circuit 41 can provide the object 47 with a low (negative) voltage pulse during (in phase with) the periods in which the beam of radiation 16 is provided. In this way the generated secondary electrons 48 are accelerated away from the object 47. However, particles having a positive charge generated during the pulse are attracted and accelerated towards the object 47. Also, because of the presence of a negative voltage on the surface of the object 47 during the irradiation, electrons within the object 47 will be attracted to the surface of the object 47, increasing the secondary electron emission yield only slightly.

Secondly, the timer circuit 41 can provide the object 47 with a low voltage pulse during the periods in which no beam of radiation 16 is provided (out of phase). This leaves the secondary electron emission yield unaltered. A disadvantage is that a secondary electron cloud 49 will be present above the surface of the object 47, for a relatively long time, which increases the chance that the secondary electrons return to the surface of the object 47 causing contamination. The contamination may increase significantly with the secondary electrons cloud (49) being present for roughly 10 microseconds.

An arbitrary difference in time between application of the low voltage pulse and the beginning of the period during which the beam of radiation 16 is provided is another possibility. This makes it possible to reduce the presence of secondary electrons and the flux of electrons which are not in phase with the pulse of radiation (for instance electrons resulting from other components in the path of the radiation beam).

A lithographic projection apparatus generally comprises several optical components in succession. The radiation pulse 16 traveling along the optical components will arrive at each following optical component at a later time than at the current optical component. Thus, the arrival time of the radiation pulse 16 is different for different optical components. The timer circuit 41 synchronizes the application of the voltage pulse with the arrival of the radiation pulse 16. The width of the voltage pulse has to be such that all the secondary electrons 48 are collected by the electrode 45. This means that the voltage pulse must have a pulse duration which ends after the end of the (local) beam impinging on the object. The time duration after the end of the beam exposure must be sufficient for all (freed) secondary electrons to migrate from the object surface to the electrode 45. The amount of secondary electrons collected is a measure of the dose of radiation and of the amount of contamination on the optical components. The amount of secondary electrons can be established using measuring means such as for instance a current meter 53.

Figure 5:
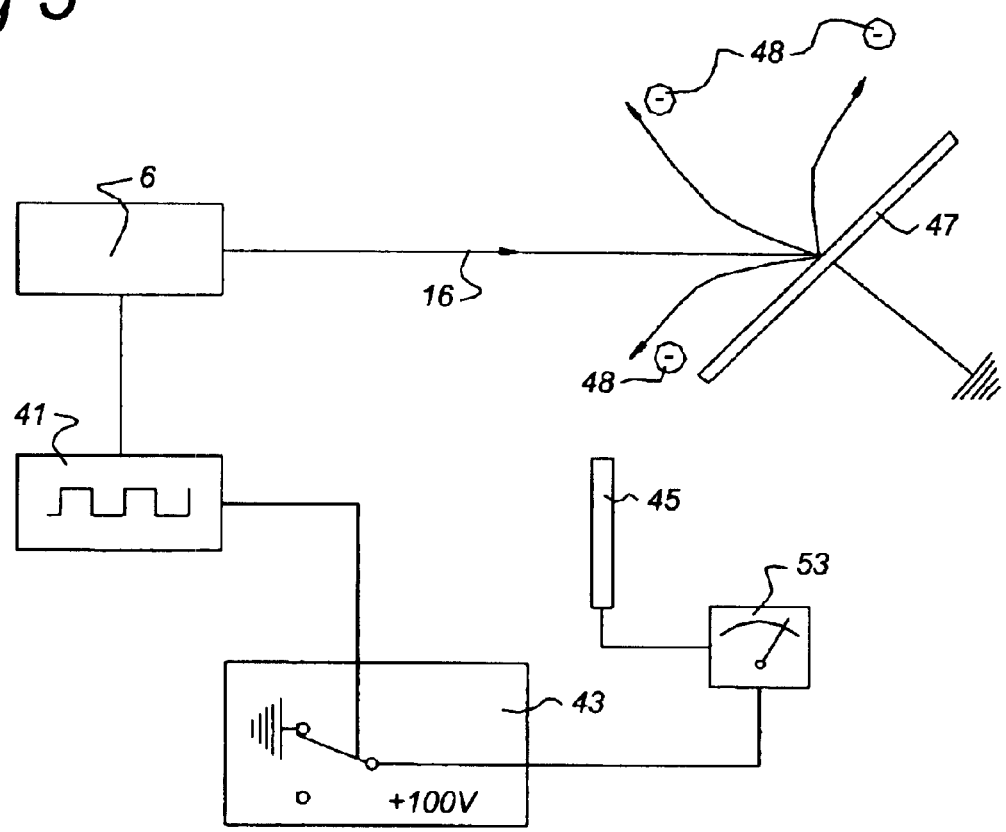
FIG. 5 shows an arrangement of a second embodiment of the present invention.

FIG. 5 shows a second embodiment according to the invention. The corresponding reference numerals of FIG. 4 are used. The embodiment of FIG. 5 is comparable with the embodiment of FIG. 4. In contrast to the embodiment of FIG. 4, the voltage source 43 is connected to the electrode 45 and the object 47 is connected to ground instead of to the voltage source 43. The voltage source 43 in FIG. 5 can switch between ground and a relatively high voltage, for instance +100 V. This voltage attracts or pulls the secondary electrons 48 to the electrode 45. In the embodiment of FIG. 4 on the contrary, the secondary electrons 48 are repelled or pushed away from the object 47. The voltage can be applied to the electrode 45 by the voltage source 43 in phase or (partly) out of phase with the pulsed beam of radiation 16 from the radiation source 6, as described above.

From calculations it can be shown that for an argon gas in which the mean free path for electrons and ions is substantially larger than a typical distance in the system (for instance the distance between the respective electrodes) the secondary electrons take approximately 3.4 ns to cross a 10 mm gap in between the electrodes with a potential difference of 100 V. During this time, the argon particles however, cross only $10^{-5}$ of the gap length and thus gain an energy of $10^{-5}$ times the potential difference between the electrodes. For a system in which the mean free path is smaller than a typical distance in the system the time it takes the electrons to cross the gap is larger than the 3.4 ns mentioned above. By applying a pulse long enough to have the electrons cross the gap, and short enough not to accelerate the ions significantly, the damage to the object induced by the ion flux significantly decreases with respect to the DC voltage case.

The electrode 45 is typically shaped as a mesh of thin wires, while a typical distance between the electrode 45 and the object 47 is 10 mm. The mesh may be placed in the radiation beam. As long as the wires of the mesh are not too close together, the mesh causes a negligible shadow in the beam. It is also possible to locate the electrode outside the radiation beam so as to have no interference with the radiation beam. A grid type electrode is another possibility.

It is to be noted that apart from measuring the amount of secondary electrons by using measuring means such as for instance a current meter 53 connected to the electrode 45, it is also possible to measure the electrical current on object 47.

Figure 6A:
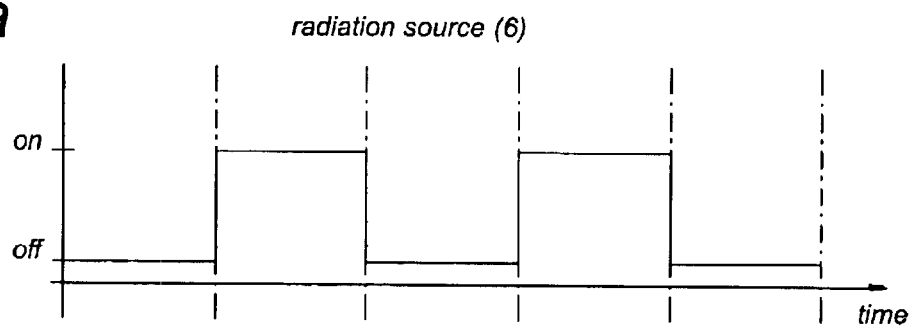
FIG. 6 gives an example of possible pulse sequences of a radiation source relative to a pulsed voltage according to an embodiment of the invention.
Figure 6B:
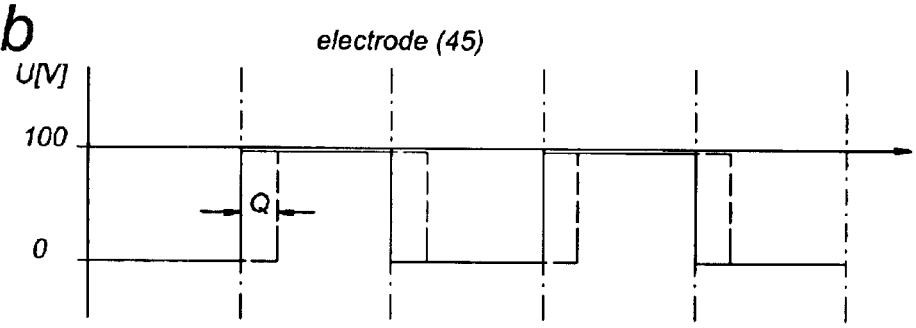
Figure 6C:
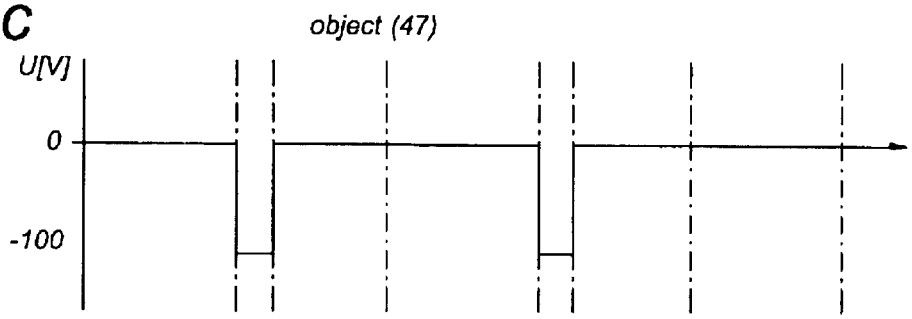
Figure 6D:
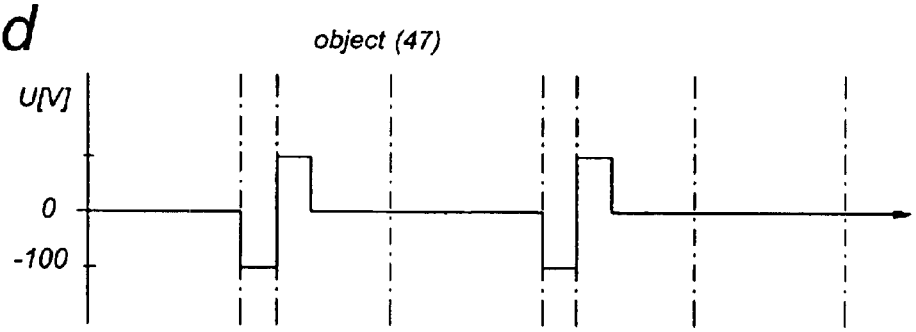

FIGS. 6a, 6b, 6c and 6d illustrate, by example, the variation of the radiation from a radiation source 6 and the variation of the potential on the electrode 45 and the object 47, respectively with time. In FIG. 6a, a radiation pulse sequence from the radiation source 6 is shown. In FIG. 6b, a positive voltage on the electrode 45 is shown. The voltage on the electrode 45 may be provided in phase with the pulse of FIG. 6a, as indicated by the solid line. However, it is also possible to provide the voltage some time after the radiation pulse is provided. This is indicated by the dashed line in FIG. 6b. In this way, there will be a phase difference Q between the radiation pulse and the voltage pulse. The voltage pulse does not have to be present during the entire radiation pulse. In FIG. 6c, the variation of a negative voltage pulse on the object 47 to be shielded with time is shown. The same remarks with reference to phase difference and presence as explained in connection with FIG. 6b apply. FIG. 6d shows an advantageous variation of the voltage on the object 47 with time. After application of a negative voltage pulse to remove the present secondary electrons, the object 47 is charged with a positive voltage pulse. The relatively heavy ions will be acted upon by the force that is generated by the electric field averaged over the time caused by the negative and positive voltage pulses. This time average will be zero or almost zero, so that the ions will not or only slightly be accelerated towards the object 47.

While specific embodiments of the invention have been described above, it will be appreciated that the invention may be practiced otherwise then as described. The description is not intended to limit the invention.

What is claimed is:

1. A lithographic projection apparatus comprising:
   a radiation system configured to provide a beam of radiation;
   a support structure configured to hold a patterning device, the patterning device configured to pattern the beam according to a desired pattern;
   a substrate table configured to hold a substrate;
   a projection system configured to project the beam as patterned onto a target portion of the substrate;
   an object;
   an electrode in vicinity of the object; and
   a voltage synchronizer configured to provide a time varying voltage difference between the object and the electrode in synchronism with a pulse of the beam, the time varying voltage imparting a repetitive negative potential to the object relative to the electrode to transport secondary electrons formed during irradiation away from the object.

2. The lithographic projection apparatus according to claim 1, wherein the object is in a path of the beam.

3. The lithographic projection apparatus according to claim 1, wherein the time varying voltage imparts the negative potential to the object relative to the electrode for a time period sufficient to transport substantially all secondary electrons formed during irradiation away from the object.

4. The lithographic projection apparatus according to claim 1, wherein the negative potential is provided for a time of between 0.01 microseconds and 10 microseconds.

5. The lithographic projection apparatus according to claim 1, wherein the negative potential is provided for 0.1 microsecond.

6. The lithographic projection apparatus according to claim 1, wherein the negative potential is between 0 V and −1000 V.

7. The lithographic projection apparatus according to claim 1, wherein the negative potential is between 0 V and −100 V.

8. The lithographic projection apparatus according to claim 1, wherein the voltage synchronizer is connected to the object and configured to provide the voltage difference between the object and the electrode.

9. The lithographic projection apparatus according to claim 1, wherein the voltage synchronizer is connected to the electrode and configured to provide the voltage difference between the object and the electrode.

10. The lithographic projection apparatus according to claim 1, wherein the negative potential is applied in phase with a high state of the pulse of the beam.

11. The lithographic projection apparatus according to claim 1, wherein a phase difference between application of the negative potential and a high state of the pulse of the beam is arbitrary.

12. The lithographic projection apparatus according to claim 1, wherein the negative potential is succeeded by an associated positive potential.

13. The lithographic projection apparatus according to claim 12, wherein the positive voltage is between 0 V and +1000 V.

14. The lithographic projection apparatus according to claim 12, wherein the positive voltage is between 0 V and +100 V.

15. The lithographic projection apparatus according to claim 1, further comprising a radiation source configured to provide the beam in a pulsed manner between a high state and a low state.

16. The lithographic projection apparatus according to claim 1, wherein the time varying voltage has the form of a square wave.

17. The lithographic projection apparatus according to claim 1, wherein the time varying voltage has the form of a sinusoidal wave.

18. The lithographic projection apparatus according to claim 1, comprising a measuring device configured to measure current generated by secondary electrons in the electrode.

19. A method of manufacturing a device by a lithographic process, comprising:
   providing a beam of radiation;
   projecting the beam as patterned onto a target portion of a substrate; and
   providing a time varying voltage in synchronism with a pulse of the beam to at least one of an object and an electrode in vicinity of the object, the time varying voltage imparting a repetitive negative potential to the object relative to the electrode to transport secondary electrons formed during irradiation away from the object.

20. The method according to claim 19, wherein the object is in a path of the beam.

21. The method according to claim 19, comprising measuring the amount of secondary electrons incident on the electrode.

22. The method according to claim 19, wherein the negative potential is succeeded by providing an associated positive potential.

23. A lithographic projection apparatus comprising:
   a radiation system configured to provide a beam of radiation;
   a support structure configured to hold a patterning device, the patterning device configured to pattern the beam according to a desired pattern;
   a substrate table configured to hold a substrate;
   a projection system configured to project the beam as patterned onto a target portion of the substrate;
   an object in a path of the beam;
   an electrode in vicinity of the object; and
   a synchronized voltage source configured to provide a time varying voltage difference between the object and the electrode in synchronism with a pulse of the beam, the time varying voltage imparting a repetitive negative potential to the object relative to the electrode to transport secondary electrons formed during irradiation away from the object.

24. The lithographic projection apparatus according to claim 23, wherein the negative potential is succeeded by an associated positive potential.

* * * * *